United States Patent
Venugopal et al.

(10) Patent No.: US 11,262,947 B2
(45) Date of Patent: Mar. 1, 2022

(54) NON-VOLATILE STORAGE SYSTEM WITH ADAPTIVE COMMAND PROCESSING

(71) Applicant: WESTERN DIGITAL TECHNOLOGIES, INC., San Jose, CA (US)

(72) Inventors: Abhinandan Venugopal, Bengaluru (IN); Amit Sharma, Bengaluru (IN); Dinesh Kumar Agarwal, Bengaluru (IN)

(73) Assignee: Western Digital Technologies, Inc., San Jose, CA (US)

( * ) Notice: Subject to any disclaimer, the term of this patent is extended or adjusted under 35 U.S.C. 154(b) by 161 days.

(21) Appl. No.: 16/698,704

(22) Filed: Nov. 27, 2019

(65) Prior Publication Data

US 2021/0157522 A1 May 27, 2021

(51) Int. Cl.
*G06F 3/06* (2006.01)
(52) U.S. Cl.
CPC ............ *G06F 3/0659* (2013.01); *G06F 3/061* (2013.01); *G06F 3/0607* (2013.01); *G06F 3/0658* (2013.01); *G06F 3/0679* (2013.01)

(58) Field of Classification Search
CPC ...... G06F 3/0607; G06F 3/061; G06F 3/0658; G06F 3/0659; G06F 3/0679
See application file for complete search history.

(56) References Cited

U.S. PATENT DOCUMENTS

| | | | |
|---|---|---|---|
| 8,315,092 B2 | 11/2012 | Strasser et al. | |
| 8,321,647 B2 | 11/2012 | Khmelnitsky et al. | |
| 8,495,332 B2 | 7/2013 | Wakrat et al. | |
| 8,595,411 B2 | 11/2013 | Selinger et al. | |
| 9,304,692 B2 | 4/2016 | Nguyen et al. | |
| 9,424,930 B2 | 8/2016 | Wood et al. | |
| 2019/0087126 A1* | 3/2019 | Chun | G06F 3/0679 |

* cited by examiner

*Primary Examiner* — Yong J Choe
(74) *Attorney, Agent, or Firm* — Vierra Magen Marcus LLP

(57) ABSTRACT

An apparatus includes a plurality of memory die and a controller coupled to the plurality of memory die. The controller is configured to selectively process a plurality of random read commands in such a way to reduce a total time required to execute the random read commands.

18 Claims, 14 Drawing Sheets

| Command Queue 800 | |
|---|---|
| Command Number | Command |
| 1 | read D0 |
| 2 | read D1 |
| 3 | read D0 |
| 4 | read D3 |
| 5 | read D2 |
| 6 | read D0 |
| 7 | read D2 |
| 8 | read D2 |
| 9 | read D2 |
| 10 | read D3 |
| 11 | read D0 |
| 12 | read D1 |
| 13 | read D1 |
| 14 | read D3 |
| 15 | read D3 |

FIG. 8B

NON-VOLATILE STORAGE SYSTEM WITH ADAPTIVE COMMAND PROCESSING

BACKGROUND

The present application relates to semiconductor memory and, more particularly, to non-volatile memory.

Semiconductor memory is widely used in various electronic devices such as cellular telephones, digital cameras, personal digital assistants, medical electronics, mobile computing devices, laptop computers, desktop computers, servers, solid state drives, non-mobile computing devices and other devices. Semiconductor memory may include non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

Input/output operations per second (IOPS) is a performance measurement used to characterize memory systems. Random IOPS (accessing locations on a storage device in a non-contiguous manner) is one benchmark commonly used to categorize removable memory devices. It is desirable for memory systems to have high random IOPS. For low cost non-volatile memory systems, however, achieving high random IOPS is difficult.

BRIEF DESCRIPTION OF THE DRAWINGS

Like-numbered elements refer to common components in the different figures.

FIGS. 8A-8B depict an embodiment of a multi-die flash memory system.

DETAILED DESCRIPTION

Some non-volatile storage devices require low-cost implementations. To meet these requirements, memory controllers for such low-cost non-volatile storage devices typically are restricted to having a single processor, limited amount of RAM (e.g., about 500 KB), relatively low processing power, and no hardware acceleration or automation. Nevertheless, achieving high random IOPS is desirable, even in low-cost non-volatile storage devices.

To address the above-described issues, a non-volatile storage device is proposed that includes a plurality of memory die, and a controller coupled to the plurality of memory die. The controller may be a low-cost controller (e.g., including a single processor, a limited amount of RAM, relatively low processing power, and no hardware automation) and is configured to selectively process a plurality of random read commands to reduce and preferably minimize a total time required to execute the random read commands. In particular, the controller is configured to selectively process a plurality of random read commands to increase, and preferably maximize a number of parallel read operations at the plurality of memory die, and reduce the time required by the plurality of memory die to perform read-sense operations.

Figure 1A:
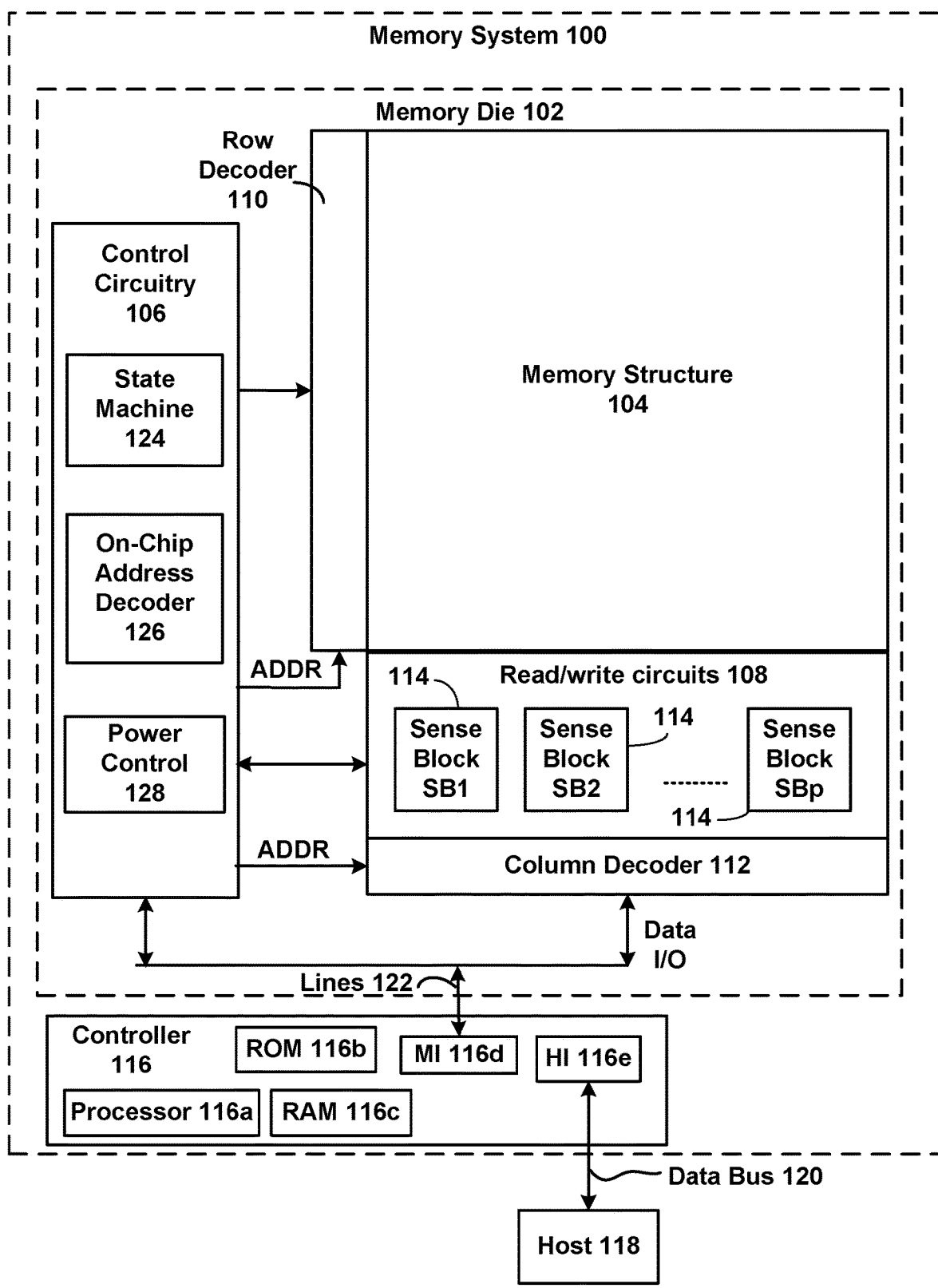
FIG. 1A is a functional block diagram of a memory device.
Figure 1B:
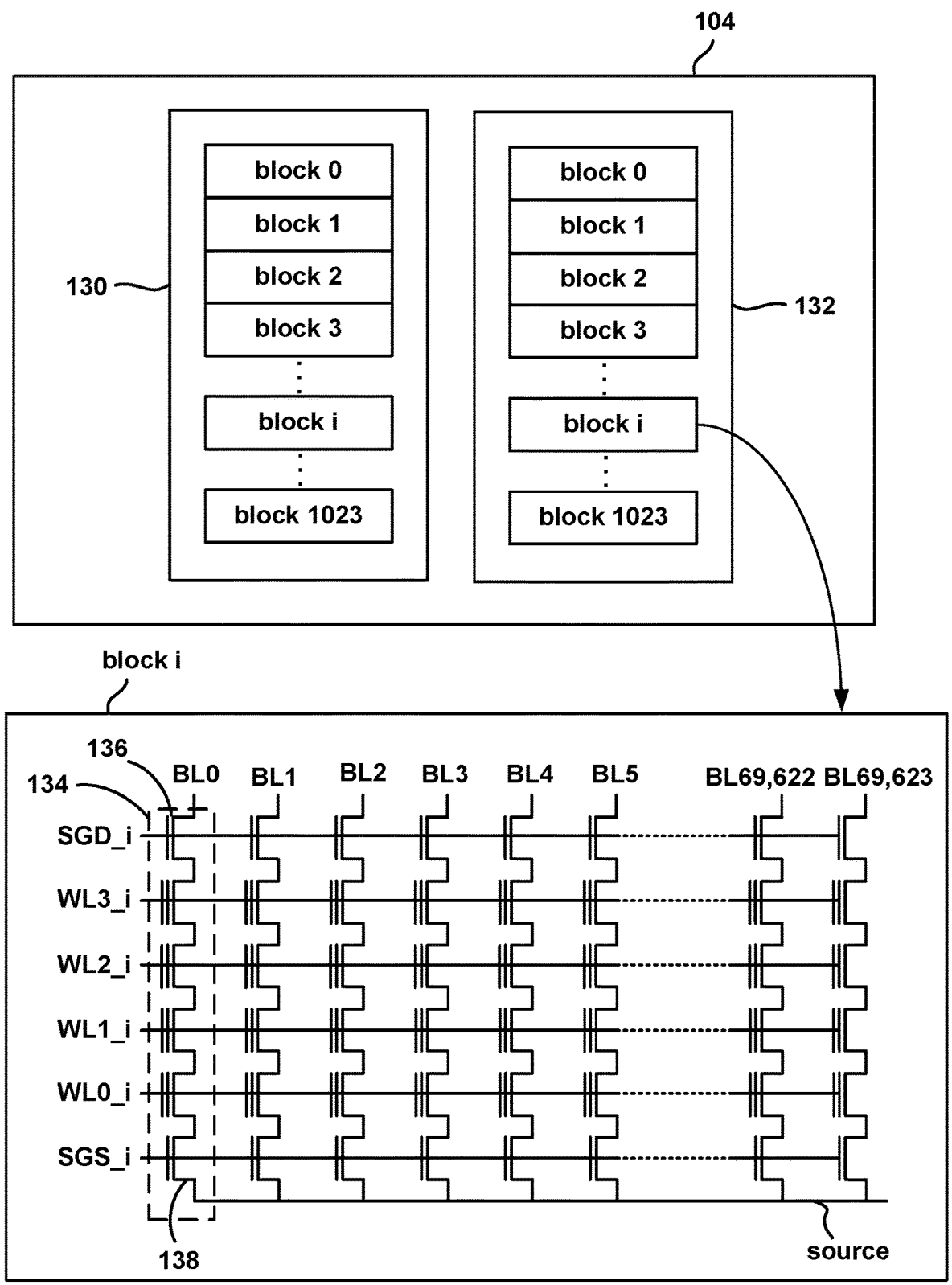
FIG. 1B is a block diagram depicting one example of a memory structure.

FIGS. 1A-1B describe an example memory system that can be used to implement the technology described herein. FIG. 1A is a functional block diagram of an example memory system 100, which includes one or more memory die 102. The components depicted in FIG. 1A are electrical circuits. In an embodiment, each memory die 102 includes a memory structure 104, control circuitry 106, and read/write circuits 108, all of which are electrical circuits. Memory structure 104 is addressable by word lines via a row decoder 110 and by bit lines via a column decoder 112. Read/write circuits 108 include multiple sense blocks 114 including SB1, SB2, . . . , SBp (sensing circuitry) and allow a page (or multiple pages) of memory cells to be read or programmed in parallel.

In some systems, a controller 116 is included in the same package (e.g., a removable storage card) as the one or more memory die 102. However, in other systems, controller 116 can be separate from memory die 102. In some embodiments controller 116 will be on a different die than the memory die 102. In some embodiments, a single controller 116 will communicate with multiple memory die 102. In other embodiments, each memory die 102 has its own controller. Commands and data are transferred between a host 118 and controller 116 via a data bus 120, and between controller 116 and the one or more memory die 102 via lines 122. In an embodiment, memory die 102 includes a set of input and/or output (I/O) pins (not shown) that connect to lines 122.

Control circuitry 106 cooperates with the read/write circuits 108 to perform memory operations (e.g., write, read, and others) on memory structure 104, and includes a state machine 124, an on-chip address decoder 126, and a power control circuit 128. State machine 124 provides die-level control of memory operations. In an embodiment, state machine 124 is programmable by software. In other embodiments, state machine 124 does not use software and is completely implemented in hardware (e.g., electrical circuits). In an embodiment, control circuitry 106 includes buffers such as registers, ROM fuses and other storage devices (not shown) for storing default values such as base voltages and other parameters.

On-chip address decoder 126 provides an address interface between addresses used by host 118 or controller 116 to the hardware address used by row decoder 110 and column decoder 112. Power control circuit 128 controls the power and voltages supplied to the word lines and bit lines during memory operations. Power control circuit 128 may include charge pumps (not shown) for creating voltages. Sense blocks 114 include bit line drivers (not shown).

State machine 124 and/or controller 116 (or equivalently functioned circuits), can be considered a control circuit that performs the functions described herein. The control circuit can include hardware only or a combination of hardware and software (including firmware). For example, a controller programmed by firmware to perform the functions described herein is one example of a control circuit. A control circuit can include a processor, Field Programmable Gate Array (FGA), Application Specific Integrated Circuit (ASIC), integrated circuit or other type of circuit.

Controller 116 (which in one embodiment is an electrical circuit) may include one or more processors 116a, ROM 116b, RAM 116c, a memory interface (MI) 116d and a host interface (HI) 116e, all of which are interconnected. The storage devices (ROM 116b, RAM 116c) store code (software) such as a set of instructions (including firmware), and one or more processors 116a are operable to execute the set of instructions to provide the functionality described herein. Alternatively or additionally, one or more processors 116a can access code from a storage device in memory structure 104, such as a reserved area of memory cells connected to one or more word lines. RAM 116c can be used to store data for controller 116, including caching program data.

Memory interface 116d, in communication with processor 116a, ROM 116b, and RAM 116c, is an electrical circuit that provides an electrical interface between controller 116 and one or more memory die 102. For example, memory interface 116d can change the format or timing of signals, provide a buffer, isolate from surges, latch I/O, etc. One or more processors 116a can issue commands to control circuitry 106 (or another component of memory die 102) via memory interface 116d. Host interface 116e provides an electrical interface with host 118 via data bus 120 to receive commands, addresses and/or data from host 118 to provide data and/or status to host 118.

In one embodiment, memory structure 104 includes a three dimensional memory array of non-volatile memory cells in which multiple memory levels are formed above a substrate, such as a wafer. Memory structure 104 may include any type of non-volatile memory that are monolithically formed in one or more physical levels of arrays of memory cells having an active area disposed above a silicon (or other type of) substrate. In one example, the non-volatile memory cells include vertical NAND strings with charge-trapping material.

In another embodiment, memory structure 104 includes a two dimensional memory array of non-volatile memory cells. In one example, the non-volatile memory cells are NAND flash memory cells utilizing floating gates. Other types of memory cells (e.g., NOR-type flash memory) also can be used.

The exact type of memory array architecture or memory cell included in memory structure 104 is not limited to the examples above. Many different types of memory array architectures or memory technologies can be used to form memory structure 104. No particular non-volatile memory technology is required for purposes of the embodiments described herein. Other examples of suitable technologies for memory cells of memory structure 104 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of memory structure 104 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

FIG. 1B depicts an example of memory structure 104. In one embodiment, an array of memory cells is divided into multiple planes. In the example of FIG. 1B, memory structure 104 is divided into two planes: plane 130 and plane 132. In other embodiments, more or less than two planes can be used. In some embodiments, each plane is divided into a number of memory erase blocks (e.g., blocks 0-1023, or another amount).

In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase also can be used. In other memory technologies (e.g., MRAM, PCM, etc.) used in other embodiments implementing the technology described herein, memory cells may be overwritten without an erase operation and so erase blocks may not exist.

Each memory erase block includes many memory cells. The design, size, and organization of a memory erase block depends on the architecture and design for the memory structure 104. As used herein, a memory erase block is a contiguous set of memory cells that share word lines and bit lines. For example, erase block i of plane 132 of FIG. 1B includes memory cells that share word lines WL0 WL1 WL2_i and WL3_i and share bit lines BL0-BL69,623.

In one embodiment, a memory erase block (e.g., erase block i of plane 132) contains a set of NAND strings (e.g., NAND string 134) which are accessed via bit lines (e.g., bit lines BL0-BL69,623) and word lines (WL0, WL1, WL2, WL3). FIG. 1B shows four memory cells connected in series to form a NAND string (e.g., NAND string 134). Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate (e.g., drain select gate 136), and another terminal is connected to the source line via a source select gate (e.g., source select gate 138). Although FIG. 1B shows 69624 bit lines, a different number of bit lines also can be used.

Each memory erase block and/or each memory storage unit is typically divided into a number of pages. In one embodiment, a page is a unit of programming/writing and a unit of reading. Other units of programming also can be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data are being written into the array, and also checks the ECC when data are being read from the array. In one embodiment, a page includes data stored in all memory cells connected to a common word line.

In the example discussed above, the unit of erase is a memory erase block and the unit of programming and reading is a page. Other units of operation also can be used. Data can be stored/written/programmed, read or erased a byte at a time, 1K bytes, 512K bytes, etc. No particular unit of operation is required for the technology described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to memory structure 104. For example, in one embodiment, the memory storage unit is a page sized to hold 4 KB of data. In certain embodiments, a complete memory storage unit is sized to match the number of physical memory cells across a row of memory structure 104. In one embodiment, an incomplete memory storage unit has fewer physical memory cells than a complete memory storage unit.

Figure 2:
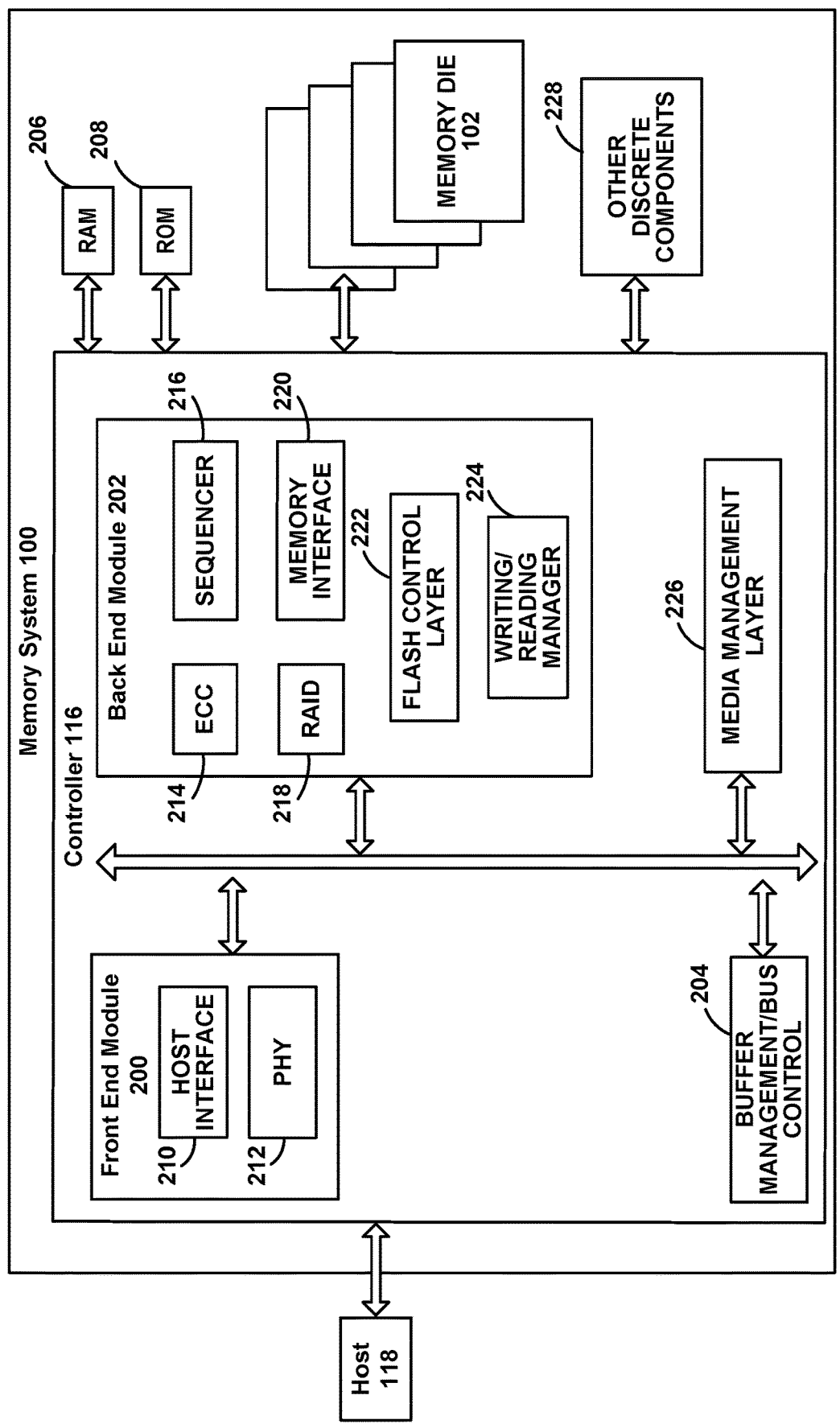
FIG. 2 is a block diagram depicting an embodiment of a memory system.

FIG. 2 is a block diagram of example memory system 100, depicting more details of an embodiment of controller 116. In an embodiment, controller 116 is a flash memory controller. Memory die 102 is not limited to flash memory technology. Thus, controller 116 is not limited to the example of a flash memory controller. As used herein, a flash memory controller is a device that manages data stored in flash memory and communicates with host 118, such as a computer or electronic device. A flash memory controller can have various functionality in addition to the specific functionality described herein. For example, a flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features.

In operation, when host 118 needs to read data from or write data to memory die 102, host 118 will communicate with controller 116. If host 118 provides a logical address to which data are to be read/written, controller 116 can convert the logical addresses received from host 118 to physical addresses in the flash memory. (Alternatively, host 118 can provide the physical address). Controller 116 also can perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 116 and memory die 102 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within host 118. In other example, memory system 100 can be in the form of a solid state drive (SSD).

In some embodiments, memory system 100 includes a single channel between controller 116 and memory die 102, although the subject matter described herein is not limited to having a single memory channel. For example, in some memory system architectures, 2, 4, 8 or more channels may exist between controller 116 and memory die 102, depending on controller capabilities. In any of the embodiments described herein, more than a single channel may exist between controller 116 and memory die 102, even if a single channel is shown in the drawings.

Controller 116 includes a front end module 200 that interfaces with host 118, a back end module 202 that interfaces with the one or more memory die 102, and various other modules that perform functions which will now be described in detail.

The components of controller 116 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example.

For example, each module may include an ASIC, an FPGA, a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 116 to perform the functions described herein. The architecture depicted in FIG. 2 is one example implementation that may (or may not) use the components of controller 116 depicted in FIG. 1A (i.e., RAM, ROM, processor, interface).

Referring again to modules of controller 116, a buffer management/bus control 204 manages buffers in random access memory (RAM) 206 and controls the internal bus arbitration of controller 116. A read only memory (ROM) 208 stores system boot code. Although illustrated as located separately from controller 116, in other embodiments one or both of RAM 206 and ROM 208 may be located within controller 116. In yet other embodiments, portions of RAM and ROM may be located both within controller 116 and outside controller 116. Further, in some implementations, controller 116, RAM 206, and ROM 208 may be located on separate semiconductor die.

Front end module 200 includes a host interface 210 and a physical layer interface (PHY) 212 that provide the electrical interface with host 118 or next level storage controller. The choice of the type of host interface 210 can depend on the type of memory being used. Examples of host interfaces 210 include, but are not limited to, SATA, SATA Express, SAS, Fibre Channel, USB, PCIe, and NVMe. Host interface 210 typically facilitates transfer for data, control signals, and timing signals.

Back end module 202 includes an error correction code (ECC) engine 214 that encodes the data bytes received from host 118, and decodes and error corrects the data bytes read from memory die 102. A command sequencer 216 generates command sequences, such as program and erase command sequences, to be transmitted to memory die 102. A RAID (Redundant Array of Independent Dies) module 218 manages generation of RAID parity and recovery of failed data. The RAID parity may be used as an additional level of integrity protection for the data being written into memory system 100. In some cases, RAID module 218 may be a part of ECC engine 214. Note that the RAID parity may be added as one more extra memory die as implied by the common name, but RAID parity also may be added within the existing memory die, e.g., as an extra plane, or extra block, or extra WLs within a block.

A memory interface 220 provides the command sequences to memory die 102 and receives status information from memory die 102. In one embodiment, memory interface 220 may be a double data rate (DDR) interface, such as a Toggle Mode 200, 400, or 800 interface. A flash control layer 222 controls the overall operation of back end module 202.

One embodiment includes a writing/reading manager 224, which can be used to manage (in conjunction with the circuits on memory die 102) the writing and reading of memory cells. In some embodiments, writing/reading manager 224 performs the processes depicted in the flow charts described below.

Additional components of memory system 100 illustrated in FIG. 2 include media management layer (MML) 226, which performs wear leveling of memory cells of memory die 102. Memory system 100 also includes other discrete components 228, such as external electrical interfaces, external RAM, resistors, capacitors, or other components that may interface with controller 116. In alternative embodiments, one or more of physical layer interface 212, RAID module 218, MML 226 and buffer management/bus controller 204 are optional components that are not necessary in controller 116.

The Flash Translation Layer (FTL) or MML 226 may be integrated as part of the flash management that may handle flash errors and interfacing with host 118. In particular, MML 226 may be a module in flash management and may be responsible for the internals of NAND management. In particular, MML 226 may include an algorithm in the memory device firmware which translates writes from host 118 into writes to memory structure 104 of memory die 102. MML 226 may be needed because memory structure 104: 1) may have limited endurance; 2) may only be written in multiples of pages; and/or 3) may not be written unless it is erased as a block.

MML 226 understands these potential limitations of memory structure 104 which may not be visible to host 118. Accordingly, MML 226 attempts to translate writes from host 118 into writes into memory structure 104. As described below, erratic bits may be identified and recorded using MML 226. This recording of erratic bits can be used for evaluating the health of blocks and/or word lines (the memory cells on the word lines).

Controller 116 may interface with one or more memory die 102. In one embodiment, controller 116 and multiple memory die 102 (together comprising memory system 100) implement an SSD, which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 102 connected to one controller 116. However, other embodiments may include multiple memory die 102 in communication with one or more controllers 116. In one example, the multiple memory die 102 can be grouped into a set of memory packages. Each memory package includes one or more memory die 102 in communication with controller 116. In one embodiment, a memory package includes a printed circuit board (or similar structure) with one or more memory die 102 mounted thereon. In some embodiments, a memory package can include molding material to encase the memory die 102 of the memory package. In some embodiments, controller 116 is physically separate from any of the memory packages.

Figure 3:
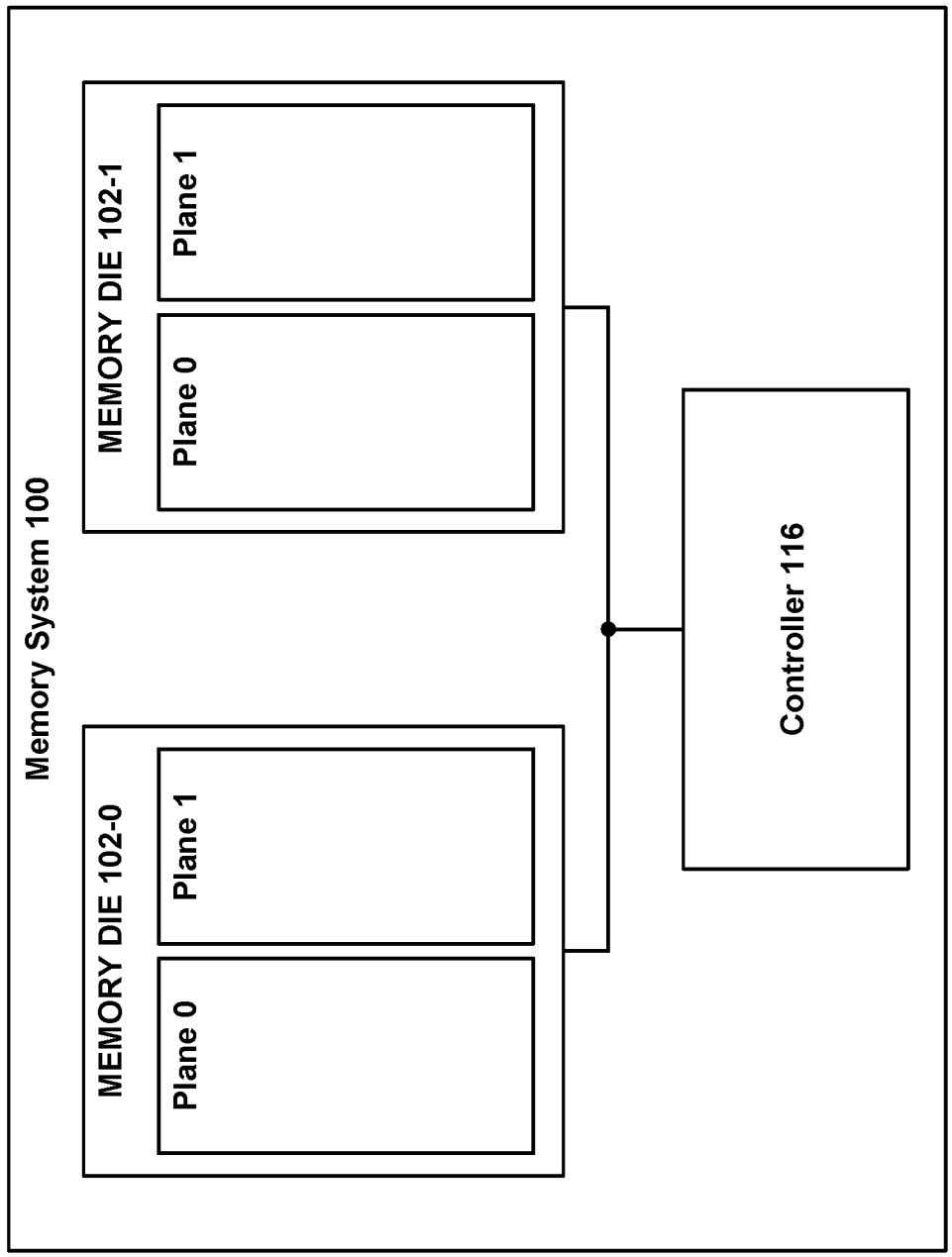
FIG. 3 depicts an embodiment of a multi-plane, multi-die flash memory system.

FIG. 3 shows another embodiment of memory system 100 that has a flash nonvolatile memory that includes two memory die (memory die 102-0 and memory die 102-1), each containing two planes (plane 0 and plane 1). Each plane has its own bit-line and word-line circuits and is capable of operating substantially independently of other planes (e.g., data can be written, or read, one plane at a time). Data may be written in a minimum unit of a page, which in some NAND memory designs corresponds to a word line in a plane. Controller 116 receives commands from a host (e.g., host 118) and directs the commands to the appropriate location in the nonvolatile memory. In an embodiment, controller 116 converts host commands into instructions that are directed to a particular die, plane, and location within a plane (e.g., to a particular page).

Figure 4:
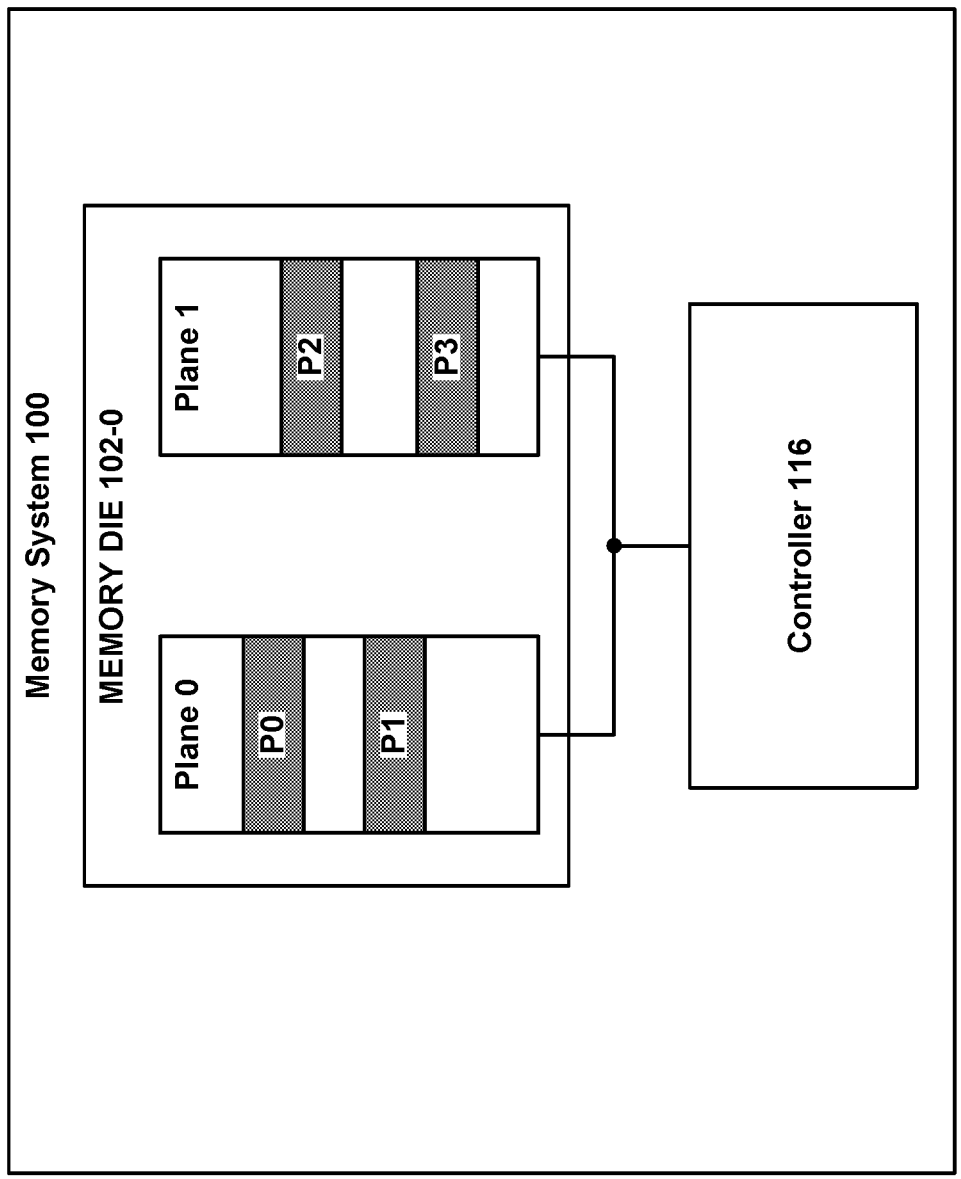
FIG. 4 depicts an embodiment of a flash memory system that includes two memory planes.

FIG. 4 shows another embodiment of memory system 100 that includes a memory die 102-0 that has two planes, plane 0 and plane 1. Four portions of data, numbered P0, P1, P2, P3, are stored in the nonvolatile memory at the locations indicated. Plane 0 and plane 1 are separately addressed by memory controller 116. Each of the portions of data occupies a single page within one of the planes, and hence the four portions will also be referred to herein as pages P0, P1, P2 and P3.

In an embodiment, a host (e.g., host 118 in FIGS. 1A and 2) issues instructions to flash memory system 100 to access pages in any order. In an embodiment, host 118 issues a series of four read commands (e.g., read P0, read P1, read P2, read P3) to flash memory system 100, to read pages P0, P1, P2 and P3, respectively, in FIG. 4. In an embodiment, host 118 sends the read commands in ascending order, i.e., host 118 sends command read P0 for page P0, then sends command read P1 for page P1, then sends command read P2 for page P2, and then sends command read P3 for page P3.

Figure 5:
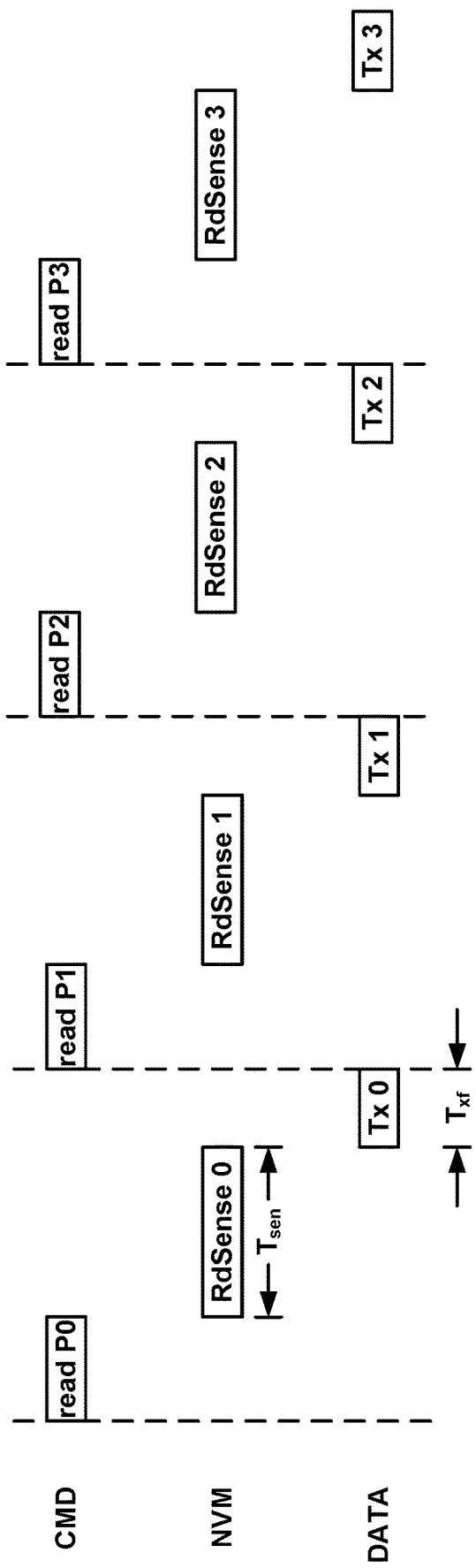
FIG. 5 shows an example timing diagram for the memory system of FIG. 4.

FIG. 5 shows an example timing diagram for memory system 100 of FIG. 4. In particular, FIG. 5 illustrates a first way that controller 116 may process four commands: read P0, read P1, read P2, read P3. Controller 116 may receive the four commands together or separately from host 118. In this example, controller 116 first sends command read P0 over a command bus ("CMD") to read page P0. Then, when the command is received by the nonvolatile memory ("NVM") the memory executes the command by performing a read-sense operation "RdSense 0" for page P0. The data that are read out of the memory cells in the portion of the nonvolatile memory occupied by page P0 are then transferred "Tx 0" from the nonvolatile memory to controller 116 over a data bus "DATA."

Controller 116 next sends command read P1 over command bus CMD to read page P1, and the process is repeated for page P1. After page P1 data are transferred back to controller 116, the process is repeated for page P2. Then, the process is repeated for page P3. As illustrated in FIG. 5, the time required for each sense operation (referred to herein as the "sense time") is $T_{sen}$, and the time required for each data transfer (referred to herein as the "transfer time") is $T_{xf}$. Ignoring the time required to receive the read commands, the total time required to perform the four read commands is $4 \times (T_{sen} + T_{xf})$.

This sequential operation depicted in FIG. 5 is well adapted to systems in which host commands are received one-at-a-time, with the host awaiting a response before sending the next command. However, more efficient methods may be used where the host sends multiple commands that are directed to relatively small portions of the nonvolatile memory (e.g., to individual pages).

Figure 6:
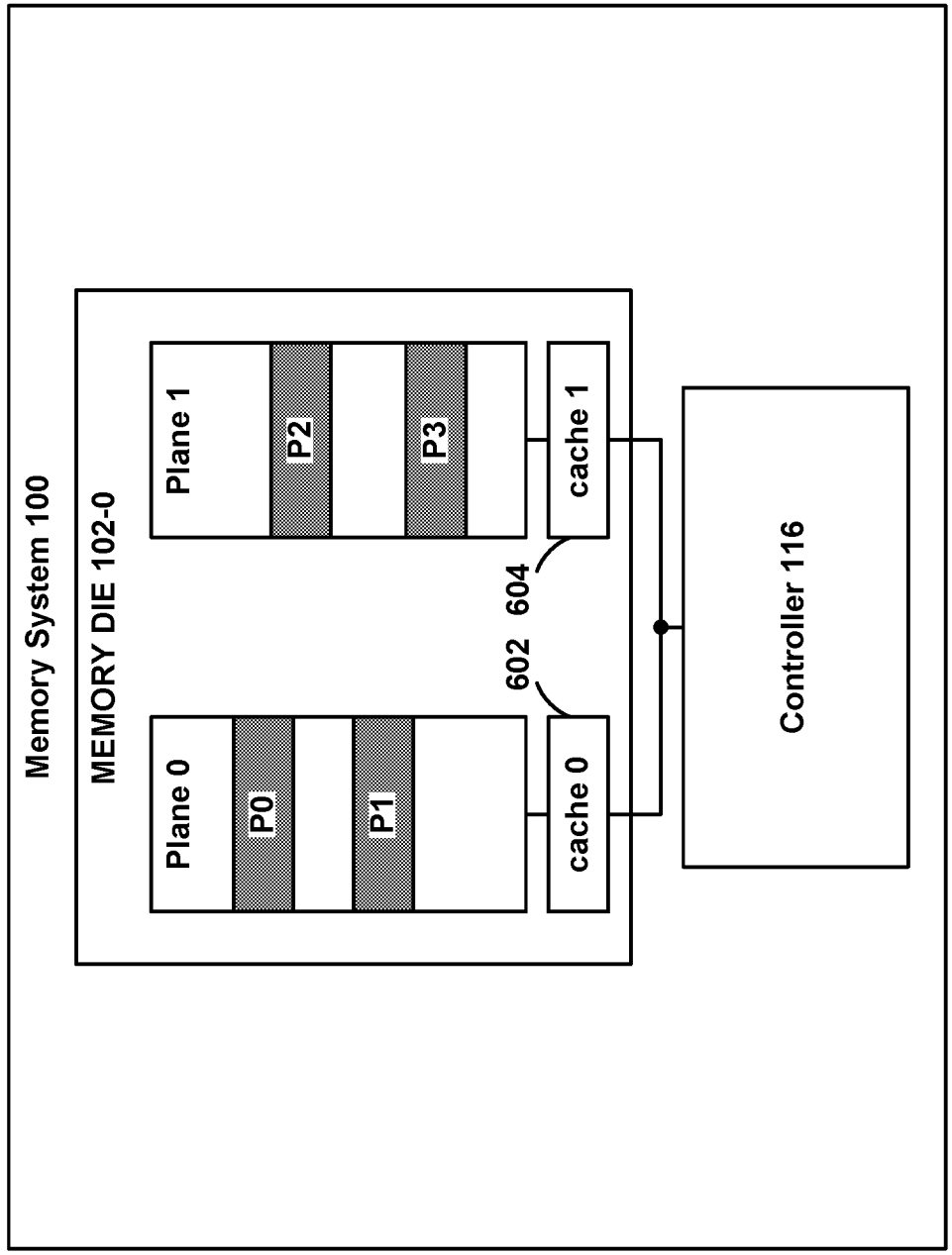
FIG. 6 depicts an embodiment of a flash memory system that includes on-chip cache.

FIG. 6 shows another embodiment of memory system 100 that include cache memory between controller 116 and the nonvolatile memory. In this embodiment, plane 0 has an associated cache 602 and plane 1 has an associated cache 604. In an embodiment, each of cache 602 and cache 604 holds one page of data. Thus, when a page is read from a plane, the data from that page may be held (or "cached") in the cache memory associated with that plane.

This may allow a subsequent read-sense operation to commence in a plane before the data from the previous read-sense operation has been sent to controller 116. Thus, a subsequent read-sense operation is performed in parallel with transfer of data from the previous read-sense operation from the cache memory to controller 116. In an embodiment, cache memory 602 and 604 each may be a simple one-page memory such as a row of latches that are on the same die as the flash memory, such as a cache buffer that is commonly located on a NAND flash memory chip.

Figure 7:
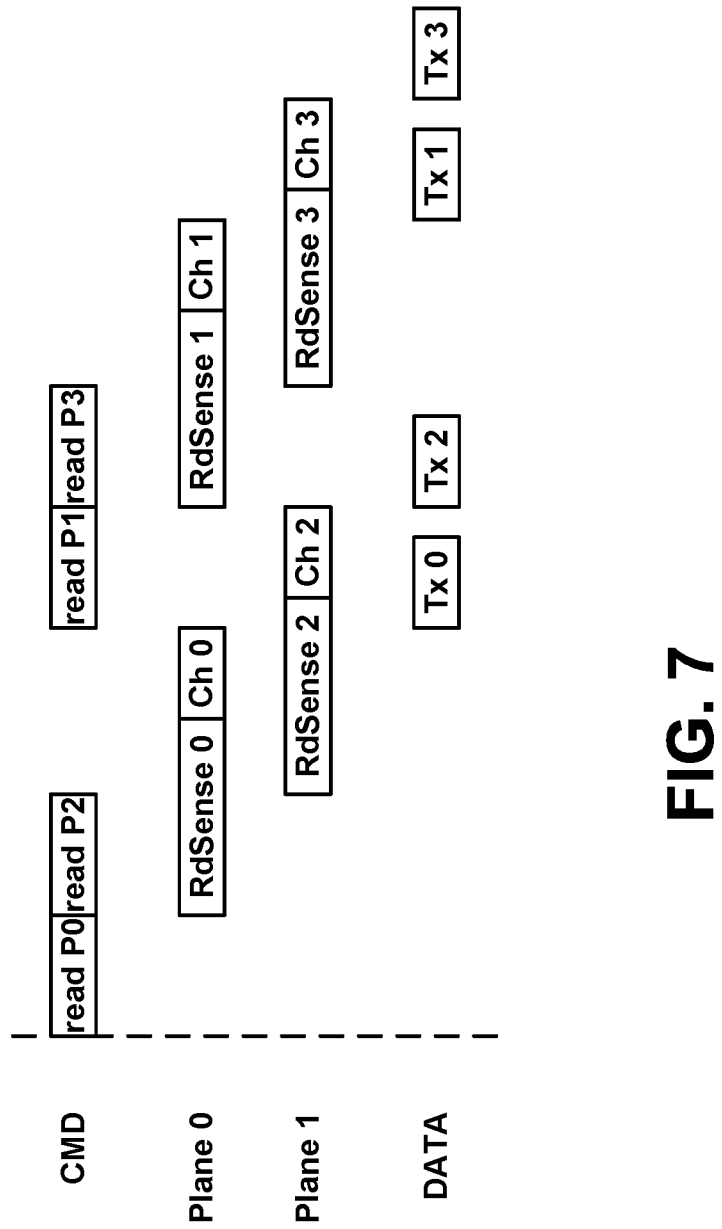
FIG. 7 shows an example timing diagram for the memory system of FIG. 6.

FIG. 7 shows a timing diagram for operation of flash memory system 600 of FIG. 6. In contrast to the timing diagram of FIG. 5, FIG. 7 shows that after RdSense 0 is completed in plane 0, the data from RdSense 0 are cached ("Ch 0"). After completing Ch 0, the nonvolatile memory transfers Tx 0 the data from RdSense 0 to controller 116. In addition, controller 116 then sends command read 1 over command bus CMD to read data 1 in plane 0. When the nonvolatile memory receives command read P1 the memory performs RdSense 1 for page P1. After RdSense 1 is completed in plane 0, the data from RdSense 1 are cached ("Ch 1"). After completing Ch 1, the nonvolatile memory transfers Tx 1 the data from RdSense 1 to controller 116.

Similarly, after RdSense 2 is completed in plane 1, the data from RdSense 2 are cached ("Ch 2"). After completing Ch 2, the nonvolatile memory transfers Tx 2 the data from RdSense 2 to controller 116. In addition, controller 116 then sends command read P3 over command bus CMD to read page P3 in plane 1. When the nonvolatile memory receives command read P3 the memory performs RdSense 3 for page P3. After RdSense 3 is completed in plane 1, the data from RdSense 3 are cached ("Ch 3"). After completing Ch 3, the nonvolatile memory transfers Tx 3 the data from RdSense 3 to controller 116.

Thus, a cache memory can allow a read-sense operation to occur in parallel with transfer of data from a previous read-sense operation instead of waiting for the completion of transfer of data from the previous read-sense operation. In general, a suitable cache is directly connected to a plane so that data can be rapidly transferred from read-sensing circuits in the plane to the cache. Thus, the time needed for caching may be very small.

Figure 8A:
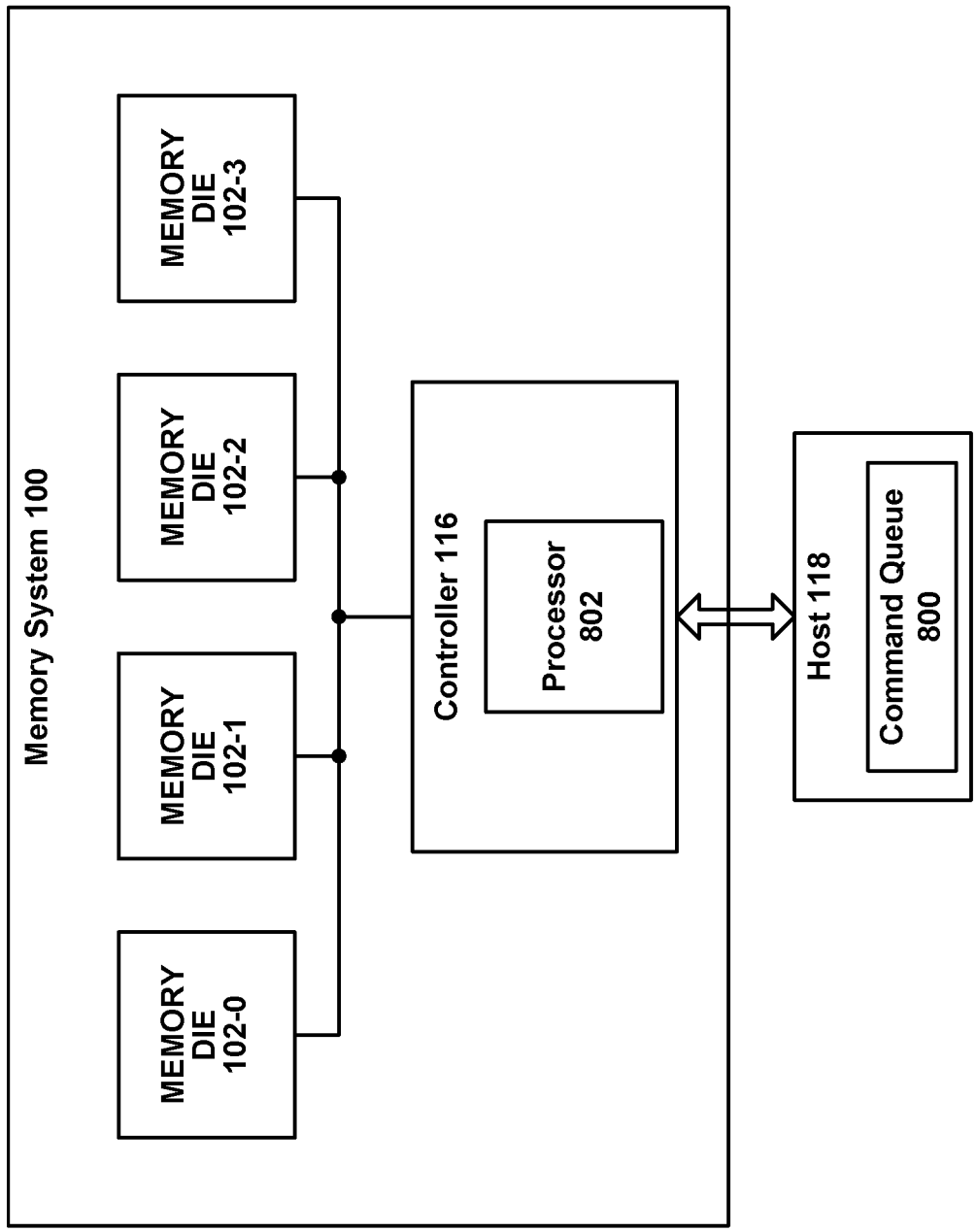

As described above, memory system 100 may include one or more memory die 102. FIGS. 8A-8B depict an embodiment of memory system 100 that includes four memory die 102-0, 102-1, 102-2 and 102-3 coupled to controller 116. Persons of ordinary skill in the art will understand that more or fewer than four memory die 102 may be used. For example, some memory systems 100 may include up to 32 (or more) memory die 102. Controller 116 is coupled to host 118, which includes a host command queue 800 which may include various commands (e.g., read commands, write commands, etc.) for reading data from and writing date to memory system 100.

FIG. 8B depicts an example contents of host command queue 800. In particular, host command queue 800 includes fifteen commands: command 1: read D0, command 2: read D1, command 3: read D0, command 4: read D3, command 5: read D2, command 6: read D0, command 7: read D2, command 8: read D2, command 9: read D2, command 10: read D3, command 11: read D0, command 12: read D1, command 13: read D1, command 14: read D3, and command 15: read D3.

In this example, a command "read Dx" instructs controller 116 to read a particular page of data from memory die 102-x. Thus, the command 1 instructs controller 116 to read a page of data from memory die 102-0, command 2 instructs controller 116 to read a page of data from memory die 102-1, command 3 instructs controller 116 to read a page of data from memory die 102-0, command 4 instructs controller 116 to read a page of data from memory die 102-3, and so on.

Figure 9:
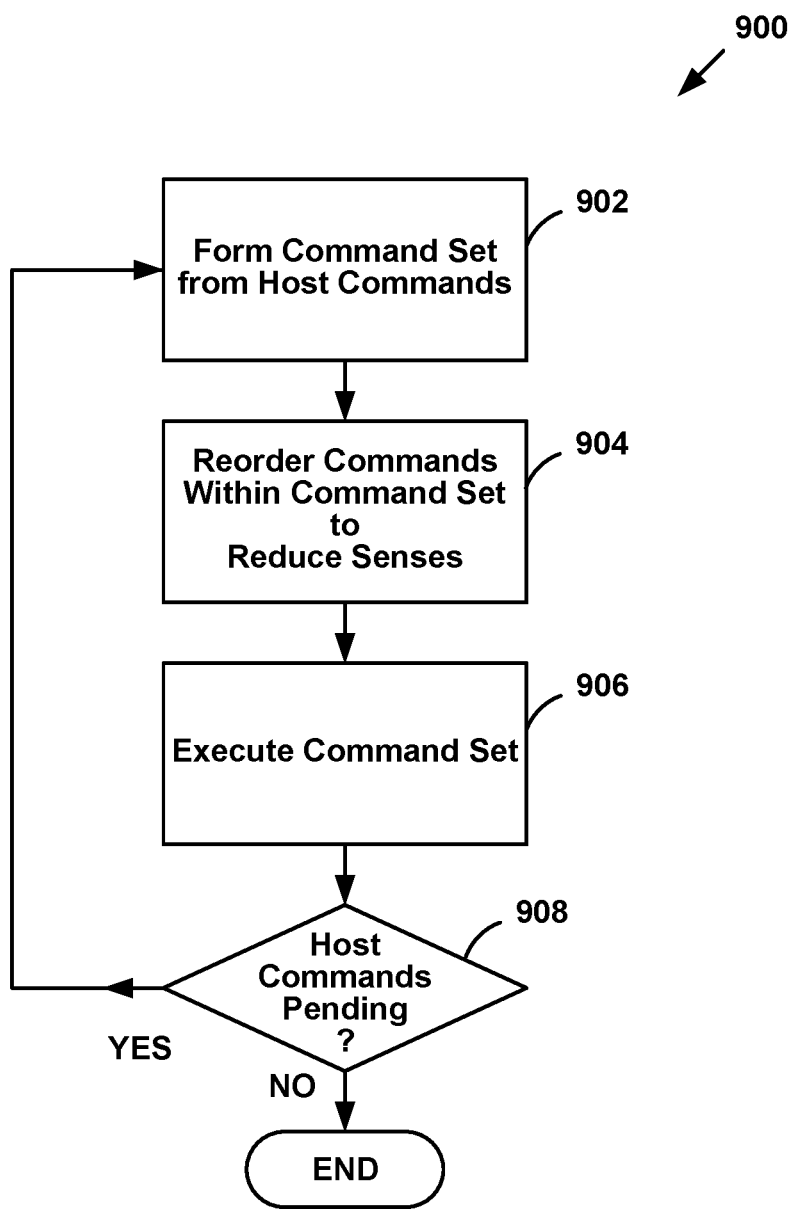
FIG. 9 is a flow chart describing one embodiment of a process for operating a multi-die flash memory system of FIG. 8A.

FIG. 9 is a flow chart describing one embodiment of a process 900 for operating a multi-die non-volatile storage device, such as memory system 100 of FIGS. 8A-8B. In an embodiment, process 900 is implemented by controller 116 of FIG. 8A. Beginning at step 902, a command set is formed from multiple host commands. For example, referring to FIGS. 8A-8B, controller 116 collects multiple commands from host command queue 800 to form a command set. In an example embodiment, controller 116 collects a maximum of five commands for each command set. In other embodiments, each command set may include more or less than five commands.

In this example, controller 116 forms a first command set:
Command Set 1: 1-read D0, 2-read D1, 3-read D0, 4-read D3, 5-read D2 where the entries in a command set indicate "command number-command." Thus, "1-read D0" means command number 1, read a page of data from memory die 102-0, "4-read D3" means command number 4, read a page of data from memory die 102-3, and so on.

Referring again to FIG. 9, at step 904, the command set formed at step 902 is reordered to reduce sense times. For example, referring to FIG. 8A, with multiple memory die 102-0, 102-1, 102-2 and 102-3, controller 116 may reduce sense times by performing multiple many die sense operations in parallel. Thus, in the example above, the first command set may be reordered as follows:

Reordered Command Set 1: 1-read D0, 2-read D1, 3-read D2, 4-read D3, 5-read D0

Referring again to FIG. 9, at step 906, the reordered command set from step 904 are executed. For example, referring to FIG. 8A, controller 116 executes Reordered Command Set 1 (1-read D0, 2-read D1, 3-read D2, 4-read D3, 5-read D0).

Figure 10:
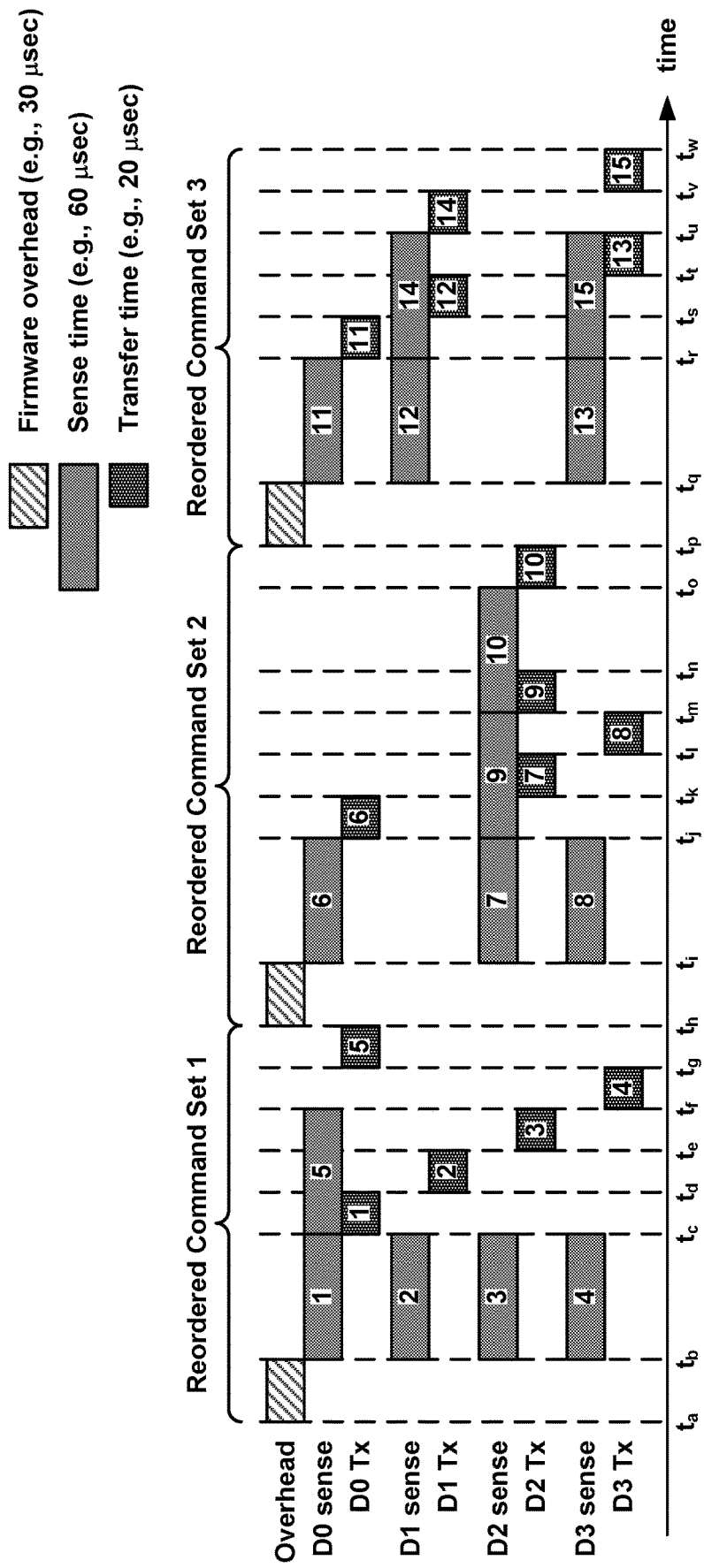
FIG. 10 is a timing diagram for an example implementation of the process of FIG. 9.

FIG. 10 depicts an example timing diagram showing the operation of process 900, with the example Reordered Command Set 1 described above implemented between times $t_a$-$t_h$. In particular, between time times $t_a$-$t_b$, controller 116 performs firmware overhead functions (e.g., logical-to-physical address translation, build descriptors for hardware units, command execution function calls) necessary to perform the various read commands specified in Reordered Command Set 1. In an example embodiment, firmware overhead time may be about 30 μsec, although other times may be used.

Between times $t_b$-$t_c$, the read sense of memory die 102-0 (command 1), memory die 102-1 (command 2), memory die 102-2 (command 3) and memory die 102-3 (command 4) are performed in parallel. In an example embodiment, each read sense may be about 60 μsec, although other times may be used.

At time $t_c$, after completion of the read sense of memory die 102-0 (command 1), memory die 102-1 (command 2), memory die 102-2 (command 3), and memory die 102-3 (command 4), the read sense of memory die 102-0 (command 5) is performed between times $t_c$-$t_f$.

In addition, between times $t_c$-$t_d$, the data that are read out of the memory cells in memory die 102-0 (command 1) are transferred from memory die 102-0 to controller 116. Between times $t_d$-$t_e$, the data that are read out of the memory cells in memory die 102-1 (command 2) are transferred from memory die 102-1 to controller 116. Between times $t_e$-$t_f$, the data that are read out of the memory cells in memory die 102-2 (command 3) are transferred from memory die 102-2 to controller 116. Between times $t_f$-$t_g$, the data that are read out of the memory cells in memory die 102-4 (command 4) are transferred from memory die 102-3 to controller 116. Finally, between times $t_g$-$t_h$, the data that are read out of the memory cells in memory die 102-0 (command 5) are transferred from memory die 102-0 to controller 116, completing the operation of Reordered Command Set 1 and step 906 of FIG. 9. In an example embodiment, each data transfer may be about 20 μsec, although other times may be used.

Referring again to FIG. 9, at step 908 a determination is made whether any more host commands are pending. In the example of FIGS. 8A-8B, additional commands are pending, so process 900 returns to step 902 and controller 116 collects the next five commands from host command queue 800 to form a next command set. In this example, controller 116 forms a second command set:

Command Set 2: 6-read D0, 7-read D2, 8-read D2, 8-read D2, 10-read D3

At step 904, the command set formed at step 902 is reordered to reduce sense times by performing die sense operations in parallel. Thus, in the example above, the second command set may be reordered as follows:

Reordered Command Set 2: 6-read D0, 7-read D2, 8-read D3, 9-read D2, 10-read D2

Referring again to FIG. 9, at step 906, the reordered command set from step 904 is executed. For example, referring to FIG. 8A, controller 116 executes Reordered Command Set 2 (6-read D0, 7-read D2, 8-read D3, 9-read D2, 10-read D2).

Referring again to FIG. 10, the example Reordered Command Set 2 described above is implemented between times $t_h$-$t_p$. In particular, between time times $t_h$-controller 116 performs firmware overhead functions necessary to perform the various read commands specified in Reordered Command Set 2.

Between times $t_i$-$t_j$, the read sense of memory die 102-0 (command 6), memory die 102-2 (command 7) and memory die 102-3 (command 8) are performed in parallel.

At time $t_j$, after completion of the read sense of memory die 102-0 (command 6), memory die 102-2 (command 7), and memory die 102-3 (command 8), the read sense of memory die 102-2 (command 9) is performed between times $t_j$-$t_m$.

In addition, between times $t_j$-$t_k$, the data that are read out of the memory cells in memory die 102-0 (command 6) are transferred from memory die 102-0 to controller 116. Between times $t_k$-$t_l$, the data that are read out of the memory cells in memory die 102-2 (command 7) are transferred from memory die 102-2 to controller 116. Between times $t_l$-$t_m$, the data that are read out of the memory cells in memory die 102-3 (command 8) are transferred from memory die 102-3 to controller 116.

At time $t_m$, after completion of the read sense of memory die 102-2 (command 9), the read sense of die 102-2 (command 10) is performed between times $t_m$-$t_o$.

Between times $t_m$-$t_o$, the data that are read out of the memory cells in memory die 102-2 (command 9) are transferred from memory die 102-2 to controller 116. Finally, between times $t_o$-$t_p$, the data that are read out of the memory cells in memory die 102-2 (command 10) are transferred from memory die 102-2 to controller 116, completing the operation of Reordered Command Set 2 and step 906 of FIG. 9.

Referring again to FIG. 9, at step 908 a determination is made whether any more host commands are pending. In the example of FIGS. 8A-8B, additional commands are pending, so process 900 returns to step 902 and controller 116 collects the next five commands from host command queue 800 to form a next command set. In this example, controller 116 forms a third command set:

Command Set 3: 11-read D0, 12-read D1, 13-read D1, 14-read D3, 15-read D3

At step 904, the command set formed at step 902 is reordered to reduce sense times by performing multiple die sense operations in parallel. Thus, in the example above, the third command set may be reordered as follows:

Reordered Command Set 3: 11-read D0, 12-read D1, 13-read D3, 14-read D1, 15-read D3

Referring again to FIG. 9, at step 906, the reordered command set from step 904 is executed. For example, referring to FIG. 8A, controller 116 executes Reordered Command Set 3 (11-read D0, 12-read D1, 13-read D3, 14-read D1, 15-read D3).

Referring again to FIG. 10, the example Reordered Command Set 3 described above is implemented between times $t_p$-$t_w$. In particular, between time times $t_p$-$t_q$, controller 116 performs firmware overhead functions necessary to perform the various read commands specified in Reordered Command Set 3.

Between times $t_q$-$t_r$, the read sense of memory die 102-0 (command 11), memory die 102-1 (command 12) and memory die 102-3 (command 13) are performed in parallel.

At time $t_r$, after completion of the read sense of memory die 102-0 (command 11), memory die 102-1 (command 12), and memory die 102-3 (command 13), the read sense of memory die 102-1 (command 14) and the read sense of memory die 102-3 (command 15) are performed between times $t_r$-$t_u$.

In addition, between times $t_r$-$t_s$, the data that are read out of the memory cells in memory die 102-0 (command 11) are transferred from memory die 102-0 to controller 116. Between times $t_s$-$t_t$, the data that are read out of the memory cells in memory die 102-1 (command 12) are transferred from memory die 102-1 to controller 116. Between times $t_t$-$t_u$, the data that are read out of the memory cells in memory die 102-3 (command 13) are transferred from memory die 102-3 to controller 116. Between times $t_u$-$t_v$, the data that are read out of the memory cells in memory die 102-1 (command 14) are transferred from memory die 102-1 to controller 116. Finally, between times $t_v$-$t_w$, the data that are read out of the memory cells in memory die 102-3 (command 15) are transferred from memory die 102-3 to controller 116, completing the operation of Reordered Command Set 3 and step 906 of FIG. 9.

Referring again to FIG. 9, at step 908 a determination is made whether any more host commands are pending. In the example of FIGS. 8A-8B, no additional commands are pending, so process 900 terminates. Using the example processing times specified above, the example process depicted in FIG. 9 requires 610 μsec to complete the fifteen commands.

As described above, input/output operations per second (IOPS) is a performance measurement used to characterize memory systems like hard disk drives (HDD), solid state drives (SSD), and storage area networks (SAN). IOPS may be used along with other metrics, such as latency and throughput, to measure overall performance of a memory system.

The most common performance characteristics measured are sequential and random operations. Sequential IOPS access locations on a storage device in a contiguous manner and are generally associated with large data transfer sizes, e.g., 128 kB. Random IOPS access locations on a storage device in a non-contiguous manner and are generally associated with small data transfer sizes, e.g., a page of data (e.g., 4 kB). As used herein, a "random read command" is a read command that accesses locations on a storage device in a non-contiguous manner.

FIG. 8B illustrates a series of random read commands, as each command randomly accesses one page of data from memory die 102-0, 102-1, 102-2 and 102-3 of memory system 100 of FIG. 8A. Random IOPS is one benchmark commonly used to categorize removable memory devices. It is desirable for memory systems to have high random IOPS. Although the process of FIG. 9 achieves some improvement of random IOPS, further improvement of random IOPS of a multi-die non-volatile storage device, such as memory system 100 of FIGS. 8A-8B is possible.

Indeed, referring to FIG. 10, each of Reordered Command Set 1, Reordered Command Set 2 and Reordered Command Set 3 includes instances of sequential sense operations on the same die, and in some instances parallelism of sense operations is not fully exploited. For example, in Reordered Command Set 2 only three sense operations are performed in parallel between times $t_r$-$t_s$, and in Reordered Command Set 3 only three sense operations are performed in parallel between times $t_q$-$t_r$. Because the sensing operation is the most time consuming, increasing or maximizing parallelism of sense operations will reduce the overall time required to perform random IOPS, and thus increase random IOPS.

In some embodiments (e.g., reduced cost implementations), controller 116 includes a single processor 802 (FIG. 8A) with a limited amount of RAM (e.g., about 500 KB), relatively low processing power, and no hardware automation. As a result of these constraints, for multi-die memory systems 100, controller 116 cannot feasibly implement individual die pipelines, and thus multiple memory die 102 share a single command pipeline. Nevertheless, despite such constraints in such low-cost implementations, it is still desirable to have high random IOPS.

To address the above-described issues, a non-volatile storage device is proposed that includes a plurality of memory die, and a controller coupled to the plurality of memory die. The controller is a low-cost controller (e.g., including a single processor, a limited amount of RAM, relatively low processing power, and no hardware automation) and is configured to selectively process a plurality of random read commands to reduce and preferably minimize a total time required to execute the random read commands. Without wanting to be bound by any particular theory, it is believed that the disclosed apparatus and methods increase a number of random IOPS for low-cost non-volatile storage devices.

Figure 11:
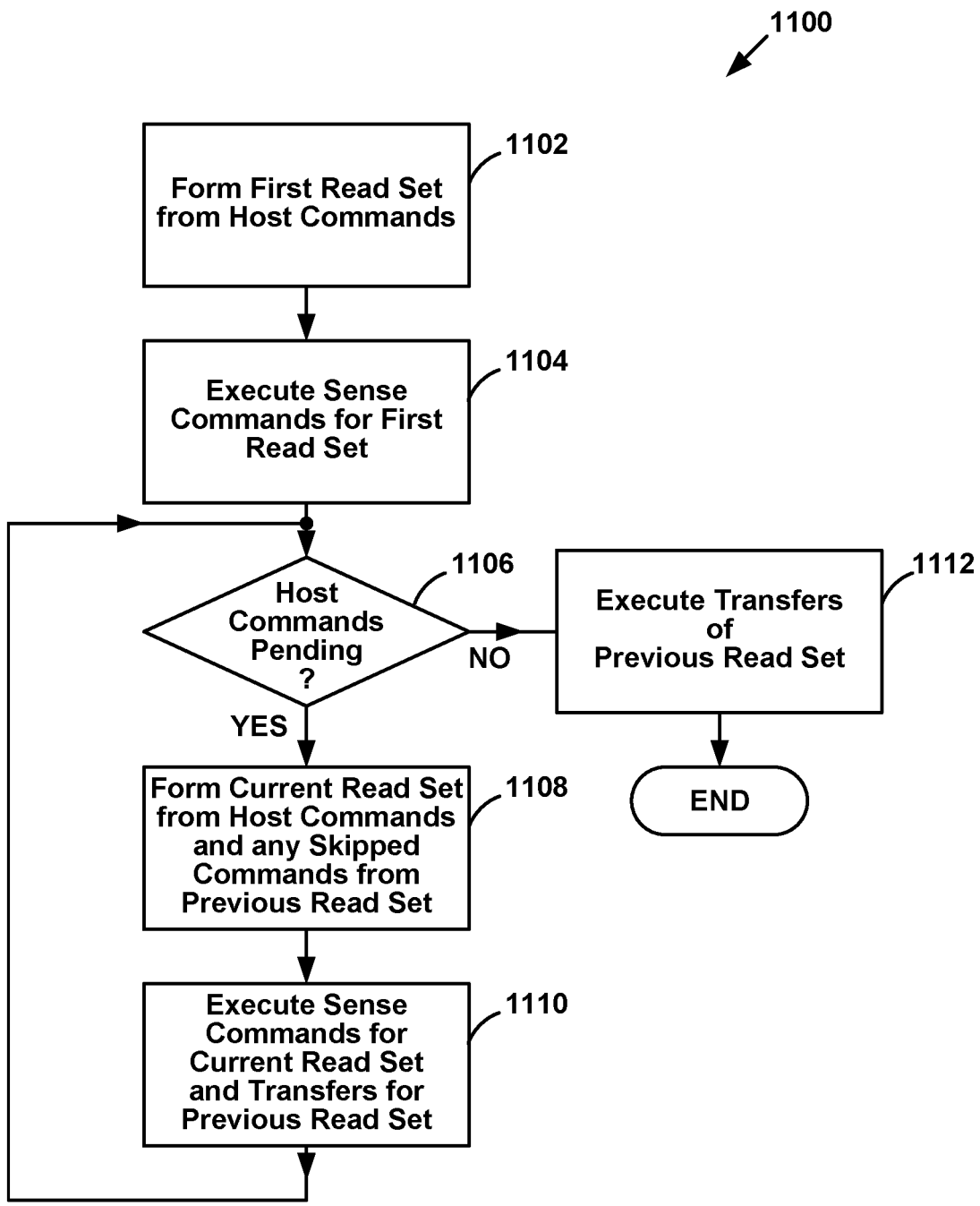
FIG. 11 is a flow chart describing another embodiment of a process for operating a multi-die flash memory system of FIG. 8A.

FIG. 11 is a flow chart describing an embodiment of a process 1100 for operating a multi-die non-volatile storage device, such as memory system 100 of FIGS. 8A-8B. In an embodiment, process 1100 is implemented by controller 116 of FIG. 8A.

Beginning at step 1102, a first read set is formed from multiple host commands. For example, referring to FIGS. 8A-8B, controller 116 collects multiple commands from host command queue 800 to form a read set. In an example embodiment, controller 116 collects a command for each memory die 102-0, 102-1, 102-2 and 102-3 of memory system 100, while skipping any commands that would result in multiple sense operations for the same memory die.

For example, referring to the example host command queue 800 of FIG. 8B, controller 116 would form a first read set as follows:

Read Set 1: 1-read D0, 2-read D1, 4-read D3, 5-read D2
   Skipped Commands: 3-read D0

Referring again to FIG. 11, at step 1104 sense commands are executed for the first read set. For example, referring to FIG. 8A, controller 116 executes sense commands for Read Set 1 (1-read D0, 2-read D1, 4-read D3, 5-read D2).

Figure 12:
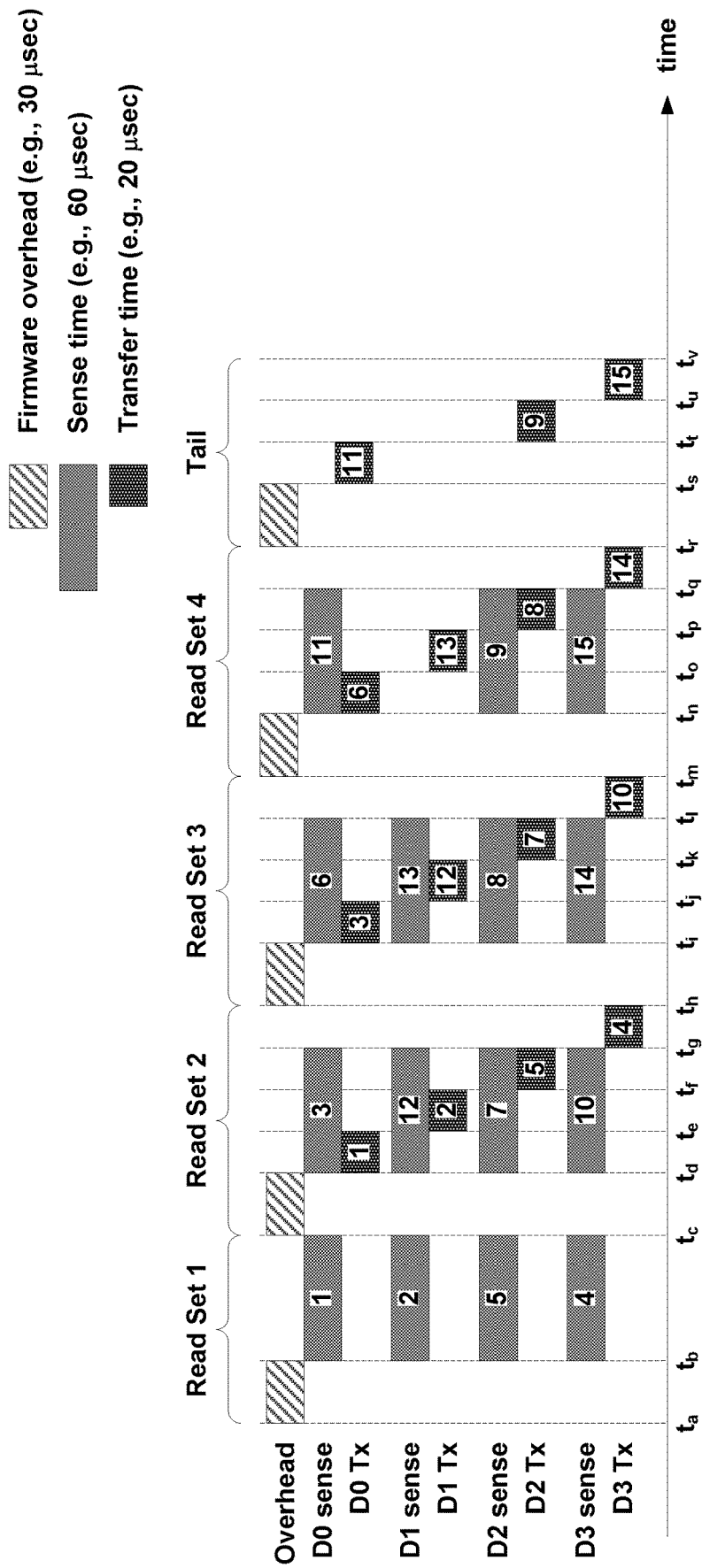
FIG. 12 is a timing diagram for an example implementation of the process of FIG. 11.

FIG. 12 depicts an example timing diagram showing the operation of process 1100, with the example Read Set 1 described above implemented between times $t_a$-$t_c$. In particular, between time times $t_a$-$t_b$, controller 116 performs firmware overhead functions necessary to perform the various read commands specified in Read Set 1. Between times $t_b$-$t_c$, the read sense of memory die 102-0 (command 1), memory die 102-1 (command 2), memory die 102-2 (command 5), and memory die 102-3 (command 4) are performed in parallel.

Referring again to FIG. 11, at step 1106 a determination is made whether any more host commands are pending. In the example of FIGS. 8A-8B, additional commands are pending, so process 1100 proceeds to step 1108 and a current read set is formed from multiple host commands and any skipped commands from the previous read set. For example, referring to FIGS. 8A-8B, controller 116 collects multiple commands from host command queue 800 and skipped commands (3-read D0) from Read Set 1 to form a current read set:

Read Set 2: 3-read D0, 7-read D2, 10-read D3, 12-read D1
Skipped Commands: 6-read D0, 8-read D2, 9-read D2, 11-read D0

Referring again to FIG. 11, at step 1110 sense commands are executed for the current read set (Read Set 2) and transfers are executed for the previous read set (Read Set 1). For example, referring to FIG. 8A, controller 116 executes sense commands for Read Set 2 (3-read D0, 7-read D2, 10-read D3, 12-read D1) and executes transfers for Read Set 1.

Referring again to FIG. 12, the example Read Set 2 described above is implemented between times $t_c$-$t_n$. In particular, between time times $t_c$-$t_d$, controller 116 performs firmware overhead functions necessary to perform the various read commands specified in Read Set 2.

Between times $t_d$-$t_g$, the read sense of memory die 102-0 (command 3), memory die 102-1 (command 12), memory die 102-2 (command 7), and memory die 102-3 (command 10) are performed in parallel.

In addition, between times $t_d$-$t_e$, the data that are read out of the memory cells in memory die 102-0 (command 1) are transferred from memory die 102-0 to controller 116. Between times $t_e$-$t_f$, the data that are read out of the memory cells in memory die 102-1 (command 2) are transferred from memory die 102-1 to controller 116. Between times $t_f$-$t_g$, the data that are read out of the memory cells in memory die 102-2 (command 5) are transferred from memory die 102-2 to controller 116. And between times $t_g$-$t_h$, the data that are read out of the memory cells in memory die 102-3 (command 4) are transferred from memory die 102-3 to controller 116.

Referring again to FIG. 11, process 1100 loops back to step 1106, and a determination is made whether any more host commands are pending. In the example of FIGS. 8A-8B, additional commands are pending, so process 1100 proceeds to step 1108 and a current read set is formed from multiple host commands and any skipped command from the previous read set. For example, referring to FIGS. 8A-8B, controller 116 collects multiple commands from host command queue 800 and skipped commands (6-read D0, 8-read D2, 9-read D2, 11-read D0) from Read Set 2 to form a current read set:

Read Set 3: 6-read D0, 8-read D2, 13-read D1, 14-read D3
Skipped Commands: 9-read D2, 11-read D0

Referring again to FIG. 11, at step 1110 sense commands are executed for the current read set (Read Set 3) and transfers are executed for the previous read set (Read Set 2). For example, referring to FIG. 8A, controller 116 executes sense commands for Read Set 3 (6-read D0, 8-read D2, 13-read D1, 14-read D3) and executes transfers for Read Set 2.

Referring again to FIG. 12, the example Read Set 3 described above is implemented between times $t_h$-$t_m$. In particular, between time times $t_h$-$t_i$, controller 116 performs firmware overhead functions necessary to perform the various read commands specified in Read Set 3.

Between times $t_i$-$t_l$, the read sense of memory die 102-0 (command 6), memory die 102-1 (command 13), memory die 102-2 (command 8), and memory die 102-3 (command 14) are performed in parallel.

In addition, between times $t_i$-$t_j$, the data that are read out of the memory cells in memory die 102-0 (command 3) are transferred from memory die 102-0 to controller 116. Between times $t_j$-$t_k$, the data that are read out of the memory cells in memory die 102-1 (command 12) are transferred from memory die 102-1 to controller 116. Between times $t_k$-$t_l$, the data that are read out of the memory cells in memory die 102-2 (command 7) are transferred from memory die 102-2 to controller 116. And between times $t_l$-$t_m$, the data that are read out of the memory cells in memory die 102-3 (command 10) are transferred from memory die 102-3 to controller 116.

Referring again to FIG. 11, process 1100 loops back to step 1106, and a determination is made whether any more host commands are pending. In the example of FIGS. 8A-8B, additional commands are pending, so process 1100 proceeds to step 1108 and a current read set is formed from multiple host commands and any skipped command from the previous read set. For example, referring to FIGS. 8A-8B, controller 116 collects multiple commands from host command queue 800 and skipped commands (9-read D2, 11-read D0) from Read Set 3 to form a current read set:

Read Set 4: 9-read D2, 11-read D0, 15-read D3
Skipped Commands: none

Referring again to FIG. 11, at step 1110 sense commands are executed for the current read set (Read Set 4) and transfers are executed for the previous read set (Read Set 3). For example, referring to FIG. 8A, controller 116 executes sense commands for Read Set 4 (9-read D2, 11-read D0, 15-read D3) and executes transfers for Read Set 3.

Referring again to FIG. 12, the example Read Set 4 described above is implemented between times $t_m$-$t_r$. In particular, between time times $t_m$-$t_o$, controller 116 performs firmware overhead functions necessary to perform the various read commands specified in Read Set 4.

Between times $t_o$-$t_q$, the read sense of memory die 102-0 (command 11), memory die 102-2 (command 9), and memory die 102-3 (command 15) are performed in parallel.

In addition, between times $t_n$-$t_o$, the data that are read out of the memory cells in memory die 102-0 (command 6) are transferred from memory die 102-0 to controller 116. Between times $t_o$-$t_p$, the data that are read out of the memory cells in memory die 102-1 (command 13) are transferred from memory die 102-1 to controller 116. Between times $t_p$-$t_q$, the data that are read out of the memory cells in memory die 102-2 (command 8) are transferred from memory die 102-2 to controller 116. And between times $t_q$-$t_r$, the data that are read out of the memory cells in memory die 102-3 (command 14) are transferred from memory die 102-3 to controller 116.

Referring again to FIG. 11, process 1100 loops back to step 1106, and a determination is made whether any more host commands are pending. In the example of FIGS. 8A-8B, no additional commands are pending, so process 1100 proceeds to step 1112 and transfers are executed for the previous read set (Read Set 4). For example, referring to FIG. 8A, controller 116 transfers for Read Set 4.

Referring again to FIG. 12, transfers for Read Set 4 described above are implemented between times $t_r$-$t_v$. In particular, between time times $t_r$-$t_s$, controller 116 performs firmware overhead functions necessary to perform the various transfers of data from Read Set 4.

In addition, between times $t_s$-$t_t$, the data that are read out of the memory cells in memory die 102-0 (command 11) are transferred from memory die 102-0 to controller 116. Between times $t_t$-$t_o$, the data that are read out of the memory cells in memory die 102-2 (command 9) are transferred from memory die 102-2 to controller 116. And between times $t_o$-$t_v$, the data that are read out of the memory cells in memory die 102-3 (command 15) are transferred from memory die 102-3 to controller 116. Referring again to FIG. 11, process 1100 then terminates.

Using the example processing times specified above, the example process of FIG. 11 requires 510 μsec to complete the fifteen commands, which is 16.4% less time than the example process of FIG. 9. As a result, it is believed that the process of FIG. 11 will have an improved (i.e., higher) random IOPS than that of the process of FIG. 9. Indeed, without wanting to be bound by any particular theory, it is believed that the process of FIG. 11 may have a random IOPS improvement of between about 15-20% compared with that of the process of FIG. 9.

One embodiment includes an apparatus that includes a plurality of memory die, and a controller coupled to the plurality of memory die. The controller is configured to selectively process a plurality of random read commands to reduce and preferably minimize a total time required to execute the random read commands.

One embodiment includes a method including receiving random read commands at a memory device from a host, the memory device comprising a plurality of memory die, and adaptively processing the random read commands at the memory device to increase and preferably maximize a number of random input-output operations per second processed by the memory device.

One embodiment includes a system that includes a memory device comprising a plurality of memory die. and a controller coupled via a single command pipeline to each of the plurality of memory die. The controller is configured to receive random read commands from a host, and includes means for iteratively forming and executing a plurality of read sets, the plurality of read sets comprising a first read set and a current read set, the first read set comprising a plurality of the random read commands and skipping a random read command that would result in multiple sense operations for a same memory die, the current read set including the skipped random read command.

The means for means for iteratively forming and executing a plurality of read sets can be implemented by a microprocessor, microcontroller, state machine, FPGA or other type of processor in combination with decoders, sense amplifiers, voltage and current sources and other control logic performing the process of FIG. 11. For example, the means for iteratively forming and executing a plurality of read sets may include control circuitry 106, decoders 110/112, read/write circuits 108, controller 116 and processor 802 of FIGS. 1A, 2 and 8A performing the process of FIG. 11. In some embodiments, the means for iteratively forming and executing a plurality of read sets may include controller 116 and processor 802 performing the processes of FIG. 11 with or without support from the circuits on the memory die (e.g., memory die 102 of FIG. 1A).

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects. For example, the terms "first" and "second" in the phrases first register and second register are used as identification labels to distinguish the register and are not meant to indicate an order or priority.

For purposes of this document, the term "set" of objects may refer to a "set" of one or more of the objects.

The foregoing detailed description has been presented for purposes of illustration and description, and is not intended to be exhaustive or to limit to the precise form disclosed. Many modifications and variations are possible in light of the above teaching. The described embodiments were chosen to best explain the principles and practical application of the disclosed technology, to thereby enable others skilled in the art to best utilize the technology in various embodiments and with various modifications as are suited to the particular use contemplated. The scope of the disclosed technology is defined by the appended claims.

The invention claimed is:

1. An apparatus, comprising:
a plurality of memory die; and
a controller coupled to the plurality of memory die, the controller configured to selectively process a plurality of random read commands to reduce a total time required to execute the random read commands,
wherein the controller is configured to selectively process the plurality of random read commands by forming a plurality of read sets, each read set comprising a single random read command per memory die.

2. The apparatus of claim 1, wherein the controller is configured to selectively process the plurality of random read commands based on a time required by the plurality of memory die to perform read-sense operations.

3. The apparatus of claim 1, wherein the controller is configured to selectively process the plurality of random read commands by forming a plurality of read sets, each read set including no more than one random read command per memory die.

4. The apparatus of claim 1, wherein the controller is configured to selectively process the plurality of random read commands by forming a plurality of read sets, each read set skipping random read commands that would result in multiple sense operations for a same memory die.

5. The apparatus of claim 1, wherein the controller is configured to selectively process the plurality of random read commands by:
forming a first read set that includes no more than one random read command per memory die;
skipping a random read command that would result in multiple sense operations for a same memory die; and
including the skipped random read command in a subsequent read set.

6. The apparatus of claim 1, wherein the controller comprises a single processor.

7. The apparatus of claim 1, wherein the controller is coupled to the plurality of memory die via a shared command pipeline.

8. The apparatus of claim 1, wherein the controller comprises no hardware automation.

9. The apparatus of claim 1, wherein the controller is separate from and coupled to the plurality of memory die, and is configured to receive the plurality of random read commands from a host.

10. A method, comprising:
- receiving random read commands at a memory device from a host, the memory device comprising a plurality of memory die;
- adaptively processing the random read commands at the memory device to increase a number of random input-output operations per second processed by the memory device; and
- adaptively processing the plurality of random read commands by forming a plurality of read sets, each read set comprising a single random read command per memory die.

11. The method of claim 10, further comprising adaptively processing the plurality of random read commands based on a time required by the plurality of memory die to perform read-sense operations.

12. The method of claim 10, further comprising adaptively processing the plurality of random read commands by forming a plurality of read sets, each read set including no more than one random read command per memory die.

13. The method of claim 10, further comprising adaptively processing the plurality of random read commands by forming a plurality of read sets, each read set skipping random read commands that would result in multiple sense operations for a same memory die.

14. The method of claim 10, comprising using a single processor to adaptively process the plurality of random read commands.

15. The method of claim 10, wherein the plurality of memory die receive the plurality of random read commands via a shared command pipeline.

16. The method of claim 10, comprising using no hardware automation to adaptively process the plurality of random read commands.

17. A system, comprising:
- a memory device comprising a plurality of memory die; and
- a controller coupled to the plurality of memory die, the controller configured to receive random read commands from a host, the controller comprising means for iteratively forming and executing a plurality of read sets, the plurality of read sets comprising a first read set and a current read set, the first read set comprising a single random read command per memory die and skipping a random read command that would result in multiple sense operations for a same memory die, the current read set including the skipped random read command.

18. The system of claim 17, wherein the controller comprises a single processor coupled to the plurality of memory die via a shared command pipeline, and comprises no hardware automation.

\* \* \* \* \*